United States Patent [19]

Miyake et al.

[11] 3,743,968

[45] July 3, 1973

[54] COLLECTOR-BASE COUPLED DOUBLE TRANSISTOR CRYSTAL OSCILLATOR

[75] Inventors: Yasutomo Miyake, Kohoku-ku, Yokohama; Toshio Shinada, Chofu-shi, Tokyo; Takao Mogi, Utsunomiya-shi, Tochigi-ken, all of Japan

[75] Assignee: Kabushiki-Kaisha Kinsekisha Kenkyuyo, Tokyo, Japan

[22] Filed: July 15, 1971

[21] Appl. No.: 162,935

Related U.S. Application Data

[63] Continuation-in-part of Ser. No. 843,373, July 22, 1969, abandoned.

[52] U.S. Cl. .......................... 331/116 R, 331/108 D

[51] Int. Cl. .............................................. H03b 5/36

[58] Field of Search ............ 331/116 R, 159, 108 C, 331/108 D

[56] References Cited

UNITED STATES PATENTS 3,195,070 7/1965 Barditch et al. ............ 331/116 R X 3,175,168 3/1965 Miyake et al. .................. 331/116 R

OTHER PUBLICATIONS

James, "Crystal Oscillator Using Integrated Circuit Amplifiers," Electronic Engineering, January 1966, pp. 42, 43.

*Primary Examiner*—Roy Lake

*Assistant Examiner*—Siegfried H. Grimm

*Attorney*—William C. Linton and Ulle C. Linton

[57] ABSTRACT

The piezoelectric crystal oscillators are of a small size and may oscillate with fundamental frequencies and overtones of at least eleventh orders without using inductances.

1 Claim, 23 Drawing Figures

INVENTORS
YASUTOMO MIYAKE,
TOSHIO SHINADA AND
TAKAO MOGI

BY Linton and Linton
ATTORNEYS

INVENTORS
YASUTOMO MIYAKE,
TOSHIO SHINADA, AND
TAKAO MOGI

BY Linton and Linton

ATTORNEYS

INVENTORS
YASUTOMO MIYAKE,
TOSHIO SHINADA AND
TAKAO MOGI

BY Linton and Linton
ATTORNEYS

INVENTORS
YASUTOMO MIYAKE,
TOSHIO SHINADA AND
TAKAO MOGI
BY Linton and Linton
ATTORNEYS INVENTORS
YASUTOMO MIYAKE,
TOSHIO SHINADA AND
TAKAO MOGI
BY Linton and Linton
ATTORNEYS

COLLECTOR-BASE COUPLED DOUBLE TRANSISTOR CRYSTAL OSCILLATOR

The present application is a continuation-in-part of our co-pending application Ser. No. 843,373 filed July 22, 1969 and now abandoned.

The present invention relates to piezoelectric crystal oscillators which may oscillate easily with fundamental frequencies and overtones of higher orders. With the advance of integral circuit technology, the design of the circuit for integral circuits has become a commercial business. In the field of art of the piezoelectric crystal oscillator, efforts have been made to provide oscillator circuits excluding piezoelectric crystal vibrators in using integral circuits. However, heretofore it has been difficult with integral circuits to design an oscillator which may produce overtones of higher orders, because in such integral circuits, there exists a limitation that, use of inductances may not be allowed.

It is an object of the present invention to provide piezoelectric crystal oscillators for producing overtones of higher orders without using inductances.

It is another object of the present invention to provide small-size piezoelectric crystal oscillators which may produce overtones of higher orders.

It is still another and more specific object of the present invention to provide small-sized piezoelectric crystal oscillators which may produce oscillation of about 200 MHz with overtones of at least eleventh orders.

The features and advantages of the present invention will become apparent by reference to the following description taken in connection with the accompanying drawings, in which.

Figure 3A:
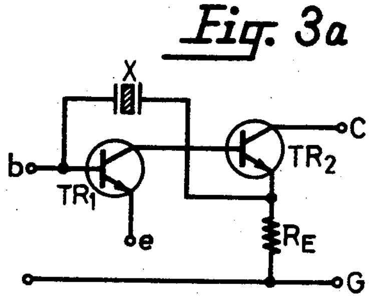

FIG. 3*a* is a fundamental circuit diagram of an oscillator according to the present invention.

Figure 3B:
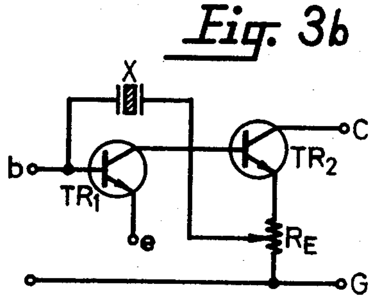

FIG. 3*b* is another fundamental circuit diagram of an oscillator according to the present invention.

Figure 4A:
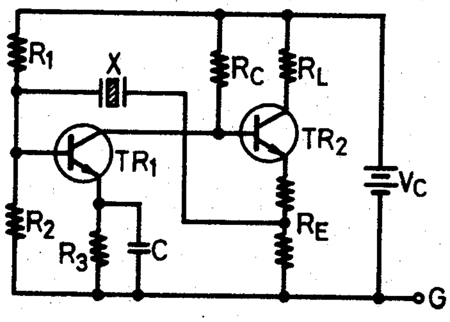

FIG. 4*a* is a circuit diagram of an embodiment of the present invention.

Figure 4B:
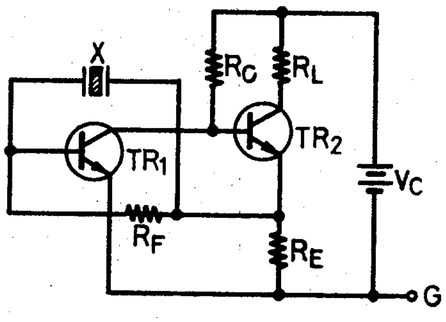

FIG. 4*b* is a circuit diagram of another embodiment of the present invention.

Figure 5A:
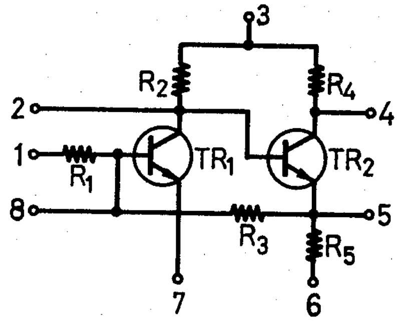

FIG. 5*a* is a circuit diagram of the interior of an integral circuit adapted to an object of the present invention.

Figure 5B:
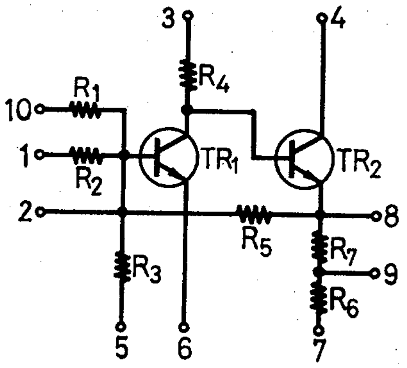

FIG. 5*b* is a circuit diagram of the interior of another integral circuit adapted to an object of the present invention.

Figure 6:
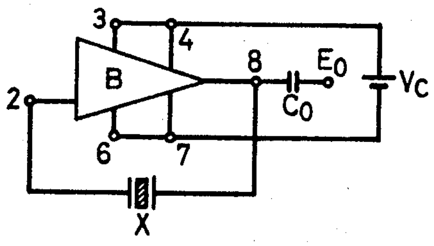

FIG. 6 is a diagram of an oscillation circuit having an integral circuit shown at B.

Figure 7:
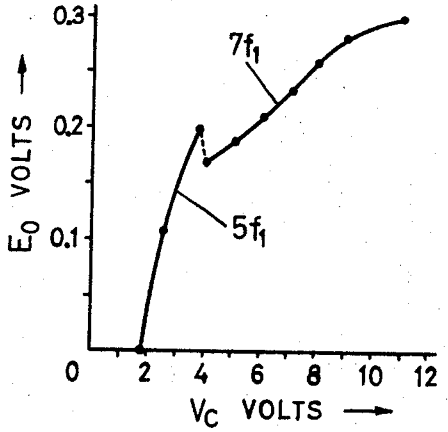

FIG. 7 shows for the oscillator of FIG. 6 characteristic curves of the output voltage against the electric source voltage.

Figure 8A:
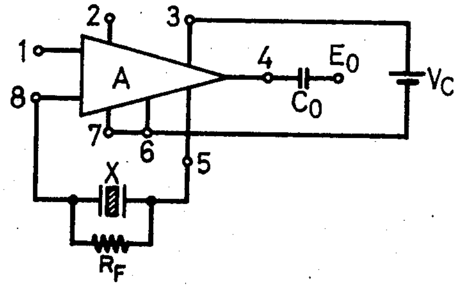

FIG. 8*a* is a diagram of an oscillation circuit having an integral circuit shown at A.

Figure 8B:
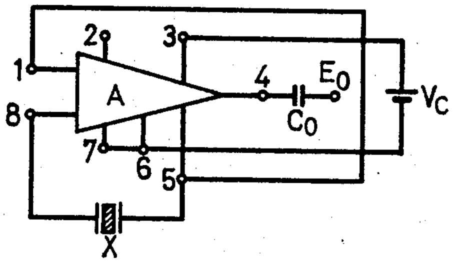

FIG. 8*b* is a diagram of another oscillation circuit having an integral circuit shown at A.

Figure 9:
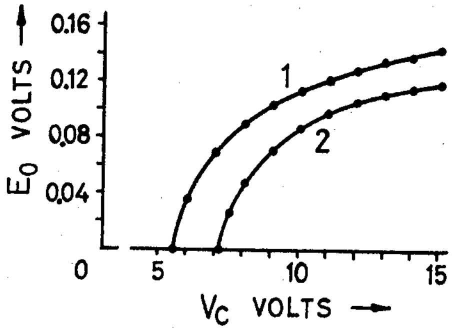

FIG. 9 shows for the oscillator of FIG. 8*a* characteristic curves of the output voltage against the electric source voltage.

Figure 10:
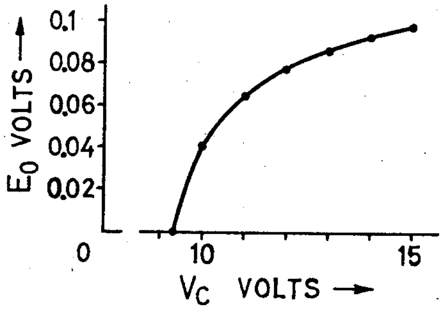

FIG. 10 shows for the oscillator of FIG. 8*b* characteristic curves of the output voltage against the electric source voltage.

Figure 11:
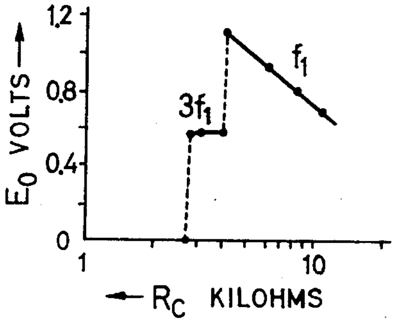

FIG. 11 shows for the oscillator of FIG. 4*b* characteristic curves of the output voltage $E_o$ against the resistance $R_c$ connected between the oscillator of the first transistor $TR_1$ and the electric source.

Figure 12:
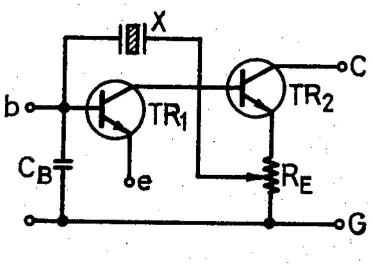

FIG. 12 is a fundamental circuit diagram of an oscillator having a condenser $C_B$ according to the present invention.

Figure 13:
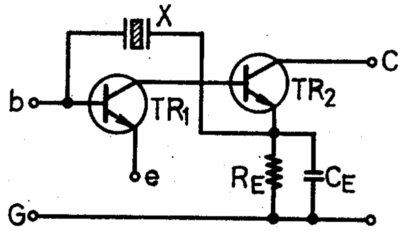

FIG. 13 is a fundamental circuit diagram of the oscillator such as shown in FIG. 12 but having a condenser $C_E$ in place of $C_B$.

Figure 14:
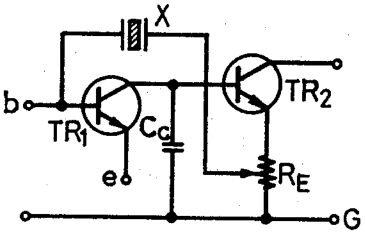

FIG. 14 is a fundamental circuit diagram of an oscillator such as shown in FIGS. 12 and 13 but having a condenser $C_C$ in place of $C_E$ or $C_B$.

Figure 15A:
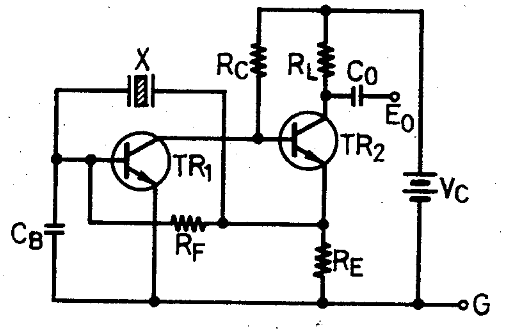

FIG. 15*a* is a circuit diagram of an embodiment of the fundamental circuit of FIG. 12.

Figure 15B:
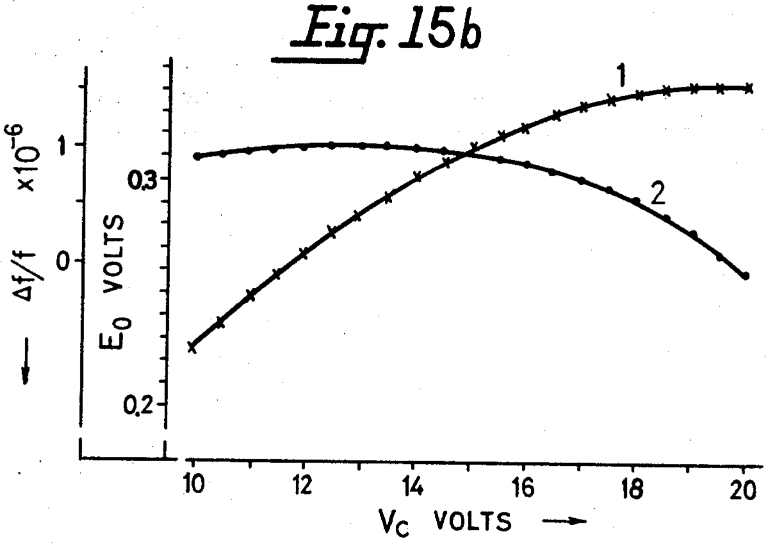

FIG. 15*b* shows for the circuit of FIG. 15*a* characteristic curves respectively of the output voltage and frequency deviation against the electric source voltage.

Figure 16A:
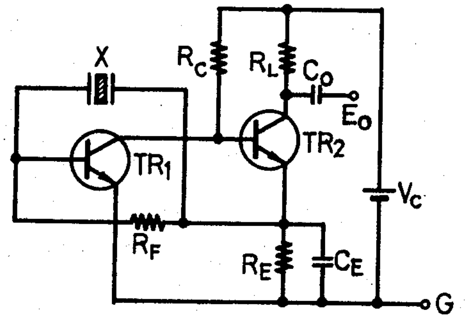

FIG. 16*a* is a circuit diagram of an embodiment of the fundamental circuit of FIG. 13.

Figure 16B:
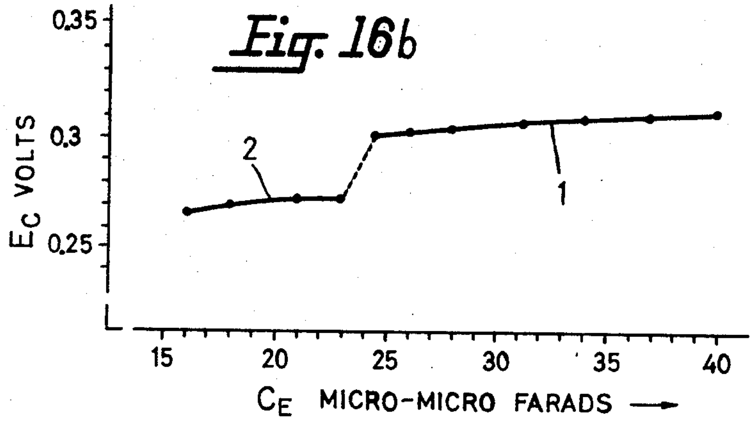

FIG. 16*b* shows for the circuit of FIG. 16*a* characteristic curves of the output voltage against $C_E$.

Figure 17:
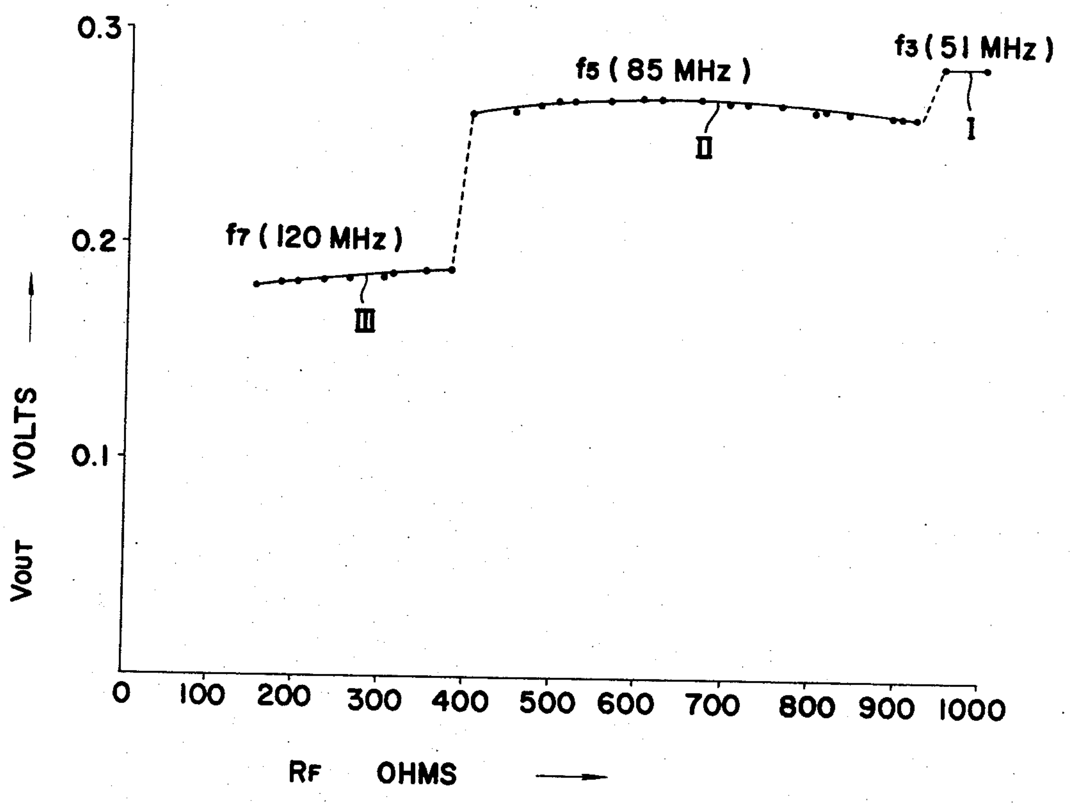

FIG. 17 is a graph showing for the oscillator of FIG. 15*a* the characteristic curves of the output voltage against values of the resistor $R_F$ which is connected in parallel with the piezoelectric crystal vibrator.

Figure 1:
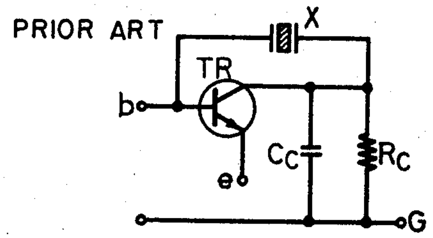
FIG. 1 is a fundamental circuit diagram of a piezoelectric crystal oscillator.

In FIG. 1 there is shown an example of the fundamental circuit of a piezoelectric crystal oscillator. This fundamental circuit comprises the essential parts for composing a crystal oscillator. It would require in this fundamental circuit to add bias circuits for composing actual oscillation circuits. In most cases, a resistor and a by-pass condenser are connected between the transistor emitter terminal and the common terminal G. Said common terminal G means, in this specification and claims, as apparent from the drawings, the ground-connected terminal of the electric source of the oscillator. Actually however, this terminal is not necessarily to be grounded mechanically. Consequently, the circuit of FIG. 1 will oscillate if the emitter is so connected to the common terminal G, causing said transistor to function normally.

Figure 2:
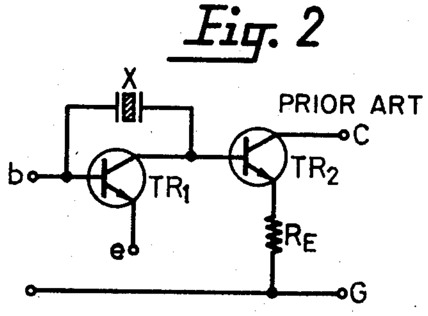
FIG. 2 is a fundamental circuit diagram of a crystal oscillator using two transistors.

In the circuit of FIG. 1, the condenser $C_C$ between the collector and the common terminal plays an important role with respect to alternating current. However, an oscillator circuit may be composed when the above-mentioned condenser is replaced by an input capacitance of the second transistor $TR_2$ as shown in FIG. 2. When a circuit is composed as stated above, no condenser is required, and an oscillator may be reduced into an integral circuit quite easily, because the oscillator circuit may be composed of transistors and resistors only.

It is known that the circuit of FIG. 2 may oscillate with overtones of up to about the fifth order. However, it is known also that it is difficult to produce oscillation with an overtone of an order higher than seventh. The present invention relates to novel composition of oscillation circuit developed from the conception of the circuit shown in FIG. 2. And, it was found through our numerous experiments that an oscillator according to the present invention may oscillate more easily with overtones of higher orders than the one having the circuit in FIG. 2.

In FIGS. 3*a* and 3*b* are shown oscillation circuits according to the present invention. And, the circuit of FIG. 3*a* which is of most fundamental composition of the present invention has two transistors $TR_1$ and $TR_2$.

The collector of transistor $TR_1$ is connected to the base of transistor $TR_2$. A resistance $R_E$ is connected between the emitter of the transistor $TR_2$ and the common terminal G. And, a quartz vibrator X is connected between the base of transistor $TR_1$ and the emitter of transistor $TR_2$. In the circuit of FIG. 3*b* which is a modification of the circuit shown in FIG. 3*a*, there is connected the quartz vibrator X at the side of transistor $TR_2$ to a midway tap of the resistor $R_E$ inserted between the emitter of transistor $TR_2$ and the common terminal G. Because there occurs no substantial different in phase, the circuit of FIG. 3*b* may as easily produce overtones of higher orders as does the circuit of FIG. 3*a*.

To actually effect the function of the circuits of FIGS. 3*a* or 3*b*, they should be provided with direct current bias means. Any known bias means may be applied. In FIGS. 4*a* and 4*b* are shown embodiments of the present invention. In the circuit of FIG. 4*a*, the emitter of transistor $TR_1$ may as well be connected through a mere resistance of small value to the common terminal G as connected thereto directly with regard to direct current. In FIG. 4*a* is connected a quartz vibrator X between the base of transistor $TR_1$ and a midway tap of resistance $R_E$ which is connected between the emitter of transistor $TR_2$ and the common terminal G. However, the quartz vibrator X may be connected between the base of transistor $TR_1$ and the emitter of transistor $TR_2$. Which way the connection is to be taken should be determined experimentally in view of oscillation wave form and output. In FIG. 4b is shown an oscillation circuit in which the base current of transistor $TR_1$ is supplied from the emitter circuit of transistor $TR_2$ through a resistance $R_F$. This circuit is suitable for the integral circuit, because in this circuit, the bias resistance may have a low value.

By varying the value of the resistor $R_F$, the order of the overtones of the crystal vibrator with which the oscillator will operate can be shifted easily. This oscillator can be operated with the fundamental frequency of the crystal vibrator and the overtones of from the second to an order higher than the tenth order.

The experiment using the circuit of FIG. 4*b* incorporated with commercial integral circuits will be explained hereunder. FIG. 5*a* shows the inner circuit of an integral circuit A in which, $R_1 = 520$ ohms, $R_2 = 2.7$ kilohms, $R_3 = 2$ kilohms, $R_4 = 520$ ohms, and $R_5 = 120$ ohms. FIG. 5*b* shows the inner circuit of another integral circuit B in which, $R_1 = 86$ ohms, $R_2 = R_3 = 1.5$ kilohms, $R_4 - 2$ kilohms, $R_5 = 500$ ohms, and $R_6 = R_7 = 100$ ohms.

FIG. 6 shows for the oscillation circuit of FIG. 4*b*, a connection diagram incorporated with said integral circuit B. In this case, the values of constants in the circuit of FIG. 4*b* is as follows: $R_F = 500$ ohms, $R_E = 200$ ohms, $R_L = 0$ ohm, and $R_C = 2$ kilohms. The fundamental frequency of the quartz vibrator X is 17.1 MHz.

In FIG. 7 there is shown characteristic curves of output $E_o$ against electric source voltage $V_C$. As seen from the characteristic curves, an oscillation of 88.5 MHz being the fifth overtone was produced at the electric source voltage between 1.9 volts and 2.7 volts. And, an oscillation of 123.9 MHz being a seventh overtone was produced at the source voltage $V_C$ over 2.8 volts. As stated above, in such a circuit, oscillation condition changes in accordance with the change in electric source voltage. This is because an oscillation circuit of the present invention uses the input capacitance of a transistor in place of normal condensers, causing the constants of the transistor to effect an oscillation condition. However, to causing oscillation, constants of elements may have values in a substantial wide range. So, an oscillator of the present invention is quite suitable to reduce it into an integral circuit, because a high accuracy of value may scarcely be guaranteed in an integral circuit. For example, the terminals of an integral circuit A were connected as shown in FIG. 8*a*. Then, such a circuit is equivalent to a circuit of FIG. 4*b* in which, $R_E = 120$ ohms, $R_F = 2$ kilohms, $R_C = 2.7$ kilohms and $R_L = 520$ ohms. How, to lowering the value of resistance $R_F$, a resistance of 200 ohms was connected in parallel to the quartz vibrator X. The results of experiments of the above circuit which are the characteristic curves of the output $E_o$ against the electric source voltage $V_C$ are shown in FIG. 9. In FIG. 9, is shown at 1, the characteristic curve using a quartz vibrator having a fundamental frequency of 17.5 MHz, and oscillated with 159.7 MHz being an overtone of ninth order. And, the characteristic curve using another quartz vibrator having a fundamental frequency of 20 MHz and oscillated with 180MHz being an overtone of ninth order is shown at 2.

In FIG. 10 is shown a characteristic curve of a circuit of FIG. 8*b*, output $E_o$ being against electric source voltage $V_C$. A quartz vibrator of a fundamental frequency of 17.7 MHz was used causing said vibrator to oscillate with a frequency of 195.2 MHz being an overtone of eleventh order.

As stated in the foregoing, since values of resistances in the circuit of the present invention do require little accuracy, oscillation with overtones of higher orders may be achieved comparatively easily by using commercial integral circuits.

Accordingly, it is a specific character of the present invention that an oscillation circuit of this invention may oscillate easily with overtones of higher orders, however said circuit may oscillate also with a fundamental frequency or overtones of lower orders.

In FIG. 11 there is shown characteristic curves of a circuit of FIG. 4*b*, output $E_o$ being against resistance $R_C$ inserted between the collector of transistor $TR_1$ and the electric source. A quartz vibrator of a fundamental frequency of 10 MHz was used at $R_F = 9$ kilohms, $R_R = 300$ ohms, $R_L = 1$ kilohm, and $V_C = 12$ volts. The output $E_o$ was determined through a coupling condenser of 2 micro-micro farads connected to the collector of transistor $TR_2$. It would be obvious from FIG. 11 that the third overtone of 30 MHz was produced in between 2.8 kilohms and 4 kilohms of $R_C$, and the fundamental frequency 10 MHz was produced at above 4.2 kilohms of $R_C$.

According to the present invention, no condenser except a coupling condenser $C_C$ for the output and a shortcircuit condenser for the electric source is required, because the oscillation circuit uses the input capacitance of a transistor. Naturally however, this circuit will oscillate when condensers are incorporated therewith like a conventional oscillator. And in some cases, it may be easier to adjust the oscillator, when some condensers are connected externally thereto. In FIGS. 12, 13 and 14 are shown some examples of the oscillation circuit having condensers connected externally. The circuit of FIG. 12 has a condenser $C_B$ connected between the base of transistor $TR_1$ and the common terminal G. The circuit of FIG. 13 has a condenser $C_E$ connected between the emitter of transistor $TR_2$ and the common terminal G. And, the circuit of FIG. 14 has a condenser $C_C$ connected between the oscillator of transistor $TR_1$ and the common terminal G.

Results of some experiments in which, circuits of the present invention have condensers connected externally will be stated hereunder.

In FIG. 15*a* is shown an oscillation circuit having a condenser $C_B$ connected between the base of transistor $TR_1$ and the common terminal G. And, FIG. 15*b* shows for the circuit of FIG. 15*a*, characteristic curves obtained in which, the output $E_o$ against the source voltage $V_C$ is shown at 1, and the frequency deviation $\Delta f/f$ is within $1\times 10^{-6}$ against change in the electric voltage $V_C$ from 10 to 20 volts. The oscillation frequency is 85.8 MHz being the fifth overtone, and $R_C = 1$ kilohm, $R_L = 1$ kilohm, $R_E = 200$ ohms, $R_F = 500$ ohms, and $C_B = 32$ micro-micro farads.

In FIG. 16*a* there is shown an oscillator circuit having a condenser $C_E$ connected between the emitter of transistor $TR_2$ and the common terminal G. And, FIG. 16*b* shows for the circuit of FIG. 16*a*, characteristic curves obtained, being the output $E_o$ against change in capacitance of said condenser. The characteristics with respect to oscillation with 53.2 MHz corresponding to the overtone of third order, an oscillation with 88.7 MHz corresponding to the overtone of fifth order are shown at 1 and 2 respectively. The constants in the circuit $R_C = R_L = 1$ kilohm, $R_E = 200$ ohms, $R_F = 800$ ohms and $V_C = 12$ volts. It will be apparent from FIG. 16*b* that within a range from 16 to 23 micro-micro farads of $C_E$ value, an overtone of fifth order is produced, an over 24.5 micro-micro farads of $C_E$ value, an overtone of third order is produced. There is a tendency that the higher the value of $C_E$ the lower the order of overtone produced. With regard to $C_B$ and $C_C$ respectively in FIG. 12 and FIG. 14, they have such a tendency alike.

In FIG. 17, curves I, II and III show respectively an oscillation range with an oscillation frequency 51 MHz which is the third overtone, an oscillation frequency 85 MHz which is the fifth overtone, and an oscillation frequency 120 MHz which is the seventh overtone of the crystal X having a fundamental oscillation frequency 17 MHz.

These characteristic curves have been obtained at circuit constants:

$R_C = 2$ kilohms
$R_L = 500$ ohms
$R_E = 900$ ohms
$C_B = 32$ micro-micro farads
$V_C = 12$ volts
$TR_1 = TR_2$ : 2SC287

Overtones of orders higher than the ninth may be obtained by using other circuit constant values.

As seen from the above, numerous embodiments will be provided from the present invention. And, by determining suitably oscillation frequency, wave form, output and oscillation stability, oscillations as desired, with frequencies from fundamentals to overtones of higher orders may be produced.

As stated above, a crystal oscillator of this invention comprises two transistors $TR_1$ and $TR_2$, the collector of first transistor $TR_1$ being connected to the base of second transistor $TR_2$, a resistor $R_E$, said resistor being inserted between and connected to the emitter of said second transistor $TR_2$ and the common terminal G, and a piezoelectric crystal vibrator X, said crystal vibrator being inserted between and connected to the base of said first transistor $TR_1$ and the emitter of said second transistor $TR_2$ or said resistor $R_E$ midway tap. And, an oscillator of this invention may oscillate easily with overtones of higher orders without being incorporated with inductances in the circuit, and also may be composed exclusively of resistors, transistors and a crystal vibrator as oscillator elements.

We claim:

1. A crystal oscillator which comprises two transistors, the collector of the first transistor being connected directly to the base of the second transistor, said second transistor having an emitter outer circuit which has a resistor inserted between and connected to said emitter and the ground of said oscillator circuit, a piezoelectric crystal vibrator, said crystal vibrator being inserted and connected to the base of said first transistor and a location in said second transistor emitter outer circuit which location is closer to said second transistor emitter than a midway tap of said resistor, and a second resistor is connected in parallel with said piezoelectric crystal vibrator with the value of resistance of said second resistor being determined so as to effect said crystal vibrator vibrating with an overtone.

* * * * *